(12) United States Patent
Park et al.

(10) Patent No.: US 9,294,167 B2
(45) Date of Patent: Mar. 22, 2016

(54) METHOD AND APPARATUS FOR AMPLIFYING MULTIPLE INPUT MULTIPLE OUTPUT (MIMO) IN WIRELESS COMMUNICATION SYSTEM

(71) Applicant: LG ELECTRONICS INC., Seoul (KR)

(72) Inventors: Sungho Park, Anyang-si (KR); Kyujin Park, Anyang-si (KR); Jiwoong Jang, Anyang-si (KR); Hangyu Cho, Anyang-si (KR); Jiwon Kang, Anyang-si (KR); Dongcheol Kim, Anyang-si (KR); Dongguk Lim, Anyang-si (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/397,332

(22) PCT Filed: Apr. 29, 2013

(86) PCT No.: PCT/KR2013/003674
§ 371 (c)(1),
(2) Date: Oct. 27, 2014

(87) PCT Pub. No.: WO2013/162344
PCT Pub. Date: Oct. 31, 2013

(65) Prior Publication Data
US 2015/0092876 A1 Apr. 2, 2015

Related U.S. Application Data

(60) Provisional application No. 61/639,083, filed on Apr. 27, 2012.

(51) Int. Cl.
*H04B 7/04* (2006.01)
*H04B 7/02* (2006.01)
*H04B 7/155* (2006.01)
*H04B 1/04* (2006.01)

(52) U.S. Cl.
CPC ............... *H04B 7/0413* (2013.01); *H04B 1/04* (2013.01); *H04B 7/026* (2013.01); *H04B 7/1555* (2013.01); *H04B 2001/045* (2013.01)

(58) Field of Classification Search
CPC .......... H04B 7/04; H04B 7/0413; H04B 7/14; H04B 7/15535; H04L 2001/0097; H04W 88/04; H04W 52/46
USPC ......................................... 375/267, 299, 347
See application file for complete search history.

(56) References Cited

U.S. PATENT DOCUMENTS 6,760,314 B1    7/2004  Iwata
(Continued)

FOREIGN PATENT DOCUMENTS

JP      2012-049936      3/2012
KR   10-2008-0075317      8/2008
(Continued)

OTHER PUBLICATIONS

PCT International Application No. PCT/KR2013/003674, Written Opinion of the International Searching Authority dated Aug. 12, 2013, 10 pages.

*Primary Examiner* — Leon Flores
(74) *Attorney, Agent, or Firm* — Lee, Hong, Degerman, Kang & Waimey (57) ABSTRACT

A method and apparatus for amplifying a MIMO signal in a wireless communication system are disclosed. A signal amplifier for amplifying a MIMO signal in a wireless communication system includes: a recognition module for recognizing network information and antenna information of a source device; and an adaptive link construction module for forming a link between a plurality of antenna with respect to the source device and a plurality of antenna with respect to the destination device on the basis of the recognized information.

12 Claims, 6 Drawing Sheets

(56) References Cited

U.S. PATENT DOCUMENTS

2010/0111226 A1   5/2010   Ko et al.
2011/0064018 A1*  3/2011   Hottinen .................. 370/315
2011/0195657 A1*  8/2011   Takeda et al. ............... 455/7

FOREIGN PATENT DOCUMENTS

| | | |
|---|---|---|
| KR | 10-2010-0087197 | 8/2010 |
| WO | 2010/087031 | 8/2010 |
| WO | 2011/022147 | 2/2011 |

* cited by examiner

Uplink (first UE base, Tx)

Downlink (First UE base, Rx)

METHOD AND APPARATUS FOR AMPLIFYING MULTIPLE INPUT MULTIPLE OUTPUT (MIMO) IN WIRELESS COMMUNICATION SYSTEM

CROSS-REFERENCE TO RELATED APPLICATIONS

This application is the National Stage filing under 35 U.S.C. 371 of International Application No. PCT/KR2013/003674, filed on Apr. 29, 2013, which claims the benefit of U.S. Provisional Application Ser. No. 61/639,083, filed on Apr. 27, 2012, the contents of which are all hereby incorporated by reference herein in their entirety.

TECHNICAL FIELD

The present invention relates to a wireless communication system, and more particularly to a method and apparatus for amplifying a Multiple Input Multiple Output (MIMO) signal in a wireless communication system.

BACKGROUND ART

Presently, various wireless devices are widely used throughout the world, such that the number of service types is rapidly increasing. Assuming that past radio data transmission is achieved on the basis of audio data (especially, voice data), current radio data transmission has been developed in various formats such as audio, video, photo, and document transmission forms, such that a data transfer rate is exponentially increased. As such, wireless communication standards for providing a higher transfer rate have recently been proposed. For example, LTE can communicate with another party at a higher speed (i.e., a maximum transfer rate of 1 GB/s) that is faster than that of HSDPA by twelve times or greater, using OFDM and MIMO technologies. However, a maximum speed of wireless communication standards capable of transmitting data at high speed can be achieved on the assumption of ideal environmental factors such as speed, channel environment, time/frequency allocation, etc. A data transfer rate capable of being actually experienced by a user is substantially lower than the maximum speed of the wireless communication standards. Specifically, performance of a wireless communication device considering a wireless channel environment is greatly influenced by a channel environment between transceiver devices of signals. Representative examples may be the presence or absence of an obstacle, the distribution of obstacles, device movement speed, etc. In case of using MIMO technology, as one important technology capable of improving data transfer rate, device restrictions caused by the design and arrangement of antennas may affect the MIMO technology.

Under various environmental and physical restricted situations, a repeater capable of amplifying RF signals may be used to compensate for performance deterioration of wireless devices. In case of using a general RF repeater, a method for receiving an RF signal of a wireless device, amplifying a signal including noise and interference, and retransmitting the amplified signal has been used.

Figure 1:
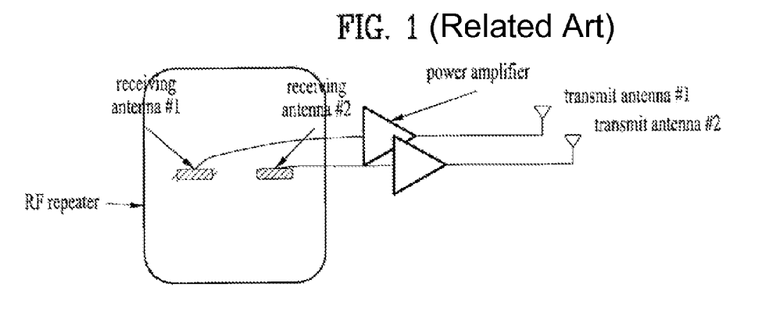
FIG. 1 is a conceptual diagram illustrating a general MIMO based signal amplifier.

FIG. 1 is a conceptual diagram illustrating a general RF signal amplifier. In case of a typical RF signal amplifier shown in FIG. 1, if antennas are installed irrespective of the position and category of antennas of the wireless device, much power emitted from the wireless device may be lost during the input process of a signal amplifier. That is, although the signal amplifier amplifies a signal, not only the signal but also noise is amplified such that it is impossible to obtain maximum performance of the amplifier. In addition, if MIMO technology is applied to the legacy RF signal amplifier, power emitted from each antenna of the wireless device generates mutual interference at a receiver of the RF signal amplifier, and an output unit of the RF signal amplifier amplifies such interference, resulting in deterioration of RF signal amplifier performance.

Figure 2:
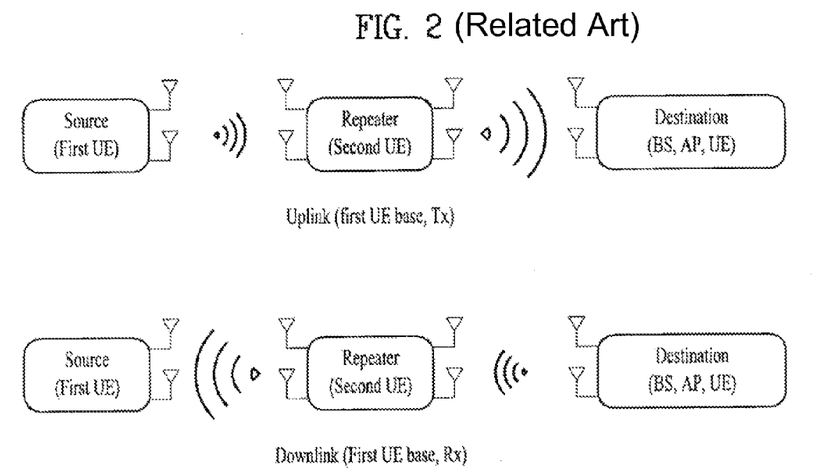
FIG. 2 is a block diagram illustrating signal amplifiers of a source device and a destination device.

FIG. 2 shows the relationship between devices configured to use general signal amplifiers that amplify signals of a source device through a signal amplifier and transmit the amplified signals to a destination device, or amplify weak signals of the destination device and transmit the amplified signals. A detailed description of a signal model of a transceiver system including a signal amplifier is shown in FIG. 3.

Figure 3:
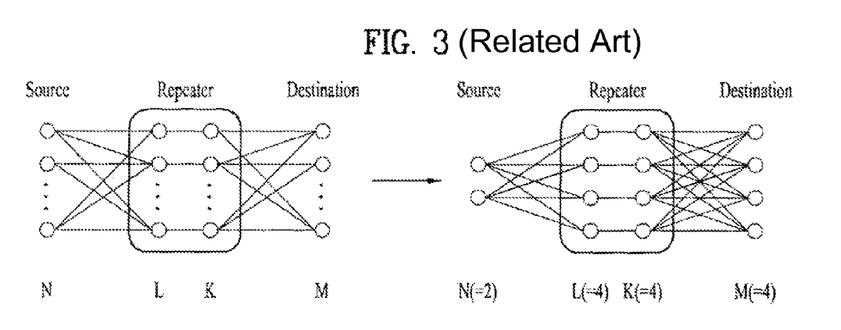
FIG. 3 is a conceptual diagram illustrating a signal model including a signal amplifier configured to use a general MIMO channel environment.

FIG. 3 shows a general model of a channel model of a legacy MIMO signal amplifier and a simplified channel model of the general model. In this case, on the assumption of user equipment (UE) uplink (UL) transmission (e.g., data transmission from UE to BS (Base Station)/AP (Access Point), N is the number of Tx antennas of a source device, L is the number of Rx antennas with respect to a source device, K is the number of Tx antennas with respect to destination, and M is the number of destination Rx antennas (the relationship between transmission and reception on downlink (DL) transmission is opposite to the relationship between transmission and reception on uplink transmission.)

Referring to a signal amplifier model in a general MIMO channel environment, the signal amplifier receives signals passing through (N×L) RF channels from a source device. Therefore, a reception (Rx) signal is a signal including antenna interference and thermal noise of a device, and the Rx signal is amplified and retransmitted so that undesired signals are unavoidably amplified. In order to solve the noise amplification problem, a distance between a source device and a signal amplifier can be minimized. For example, the user equipment (UE) may be mounted to the signal amplifier. In this case, the above-mentioned noise amplification problem can be minimized from the viewpoint of uplink. In addition, from the viewpoint of downlink, the signal amplifier receives improved quality signals from the base station (BS) using a high-performance signal amplifier Rx antenna, and signal loss of the corresponding signal is minimized and transmitted to the UE, resulting in improved DL performance.

Figure 4:
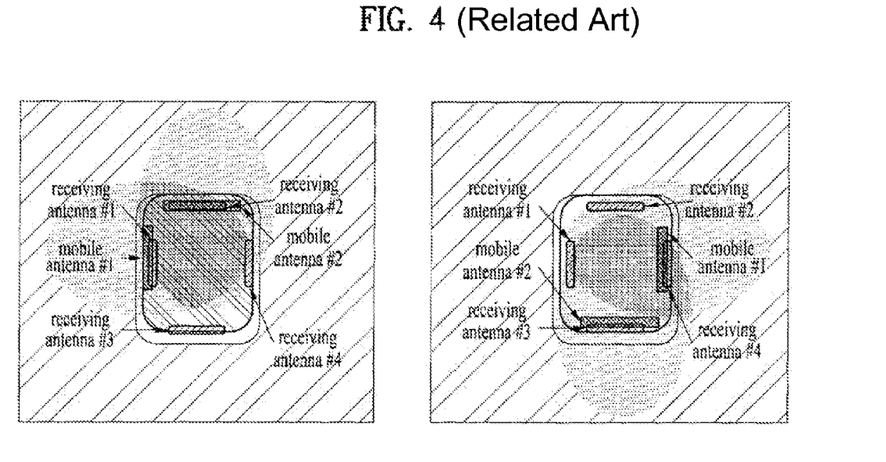
FIG. 4 is a conceptual diagram illustrating a signal amplifier for amplifying signals of a mobile device having two Tx antennas.

However, if the distance between the UE and the signal amplifier is very short, performance sensitivity is greatly increased in response to a signal amplifier antenna acting as a receiving antenna and a UE antenna acting as a mobile antenna. For example, a beam pattern of Mobile Antenna #1 is well matched to that of Receiving Antenna #1 in FIG. 4(a), so that a high SINR (Signal to Interference plus Noise Ratio) appears. In contrast, a beam pattern of Mobile Antenna #4 is not relatively well matched to that of Receiving Antenna #4, so that a relatively low SINR appears. If a UE is composed of multiple antennas (N>1), performance sensitivity may encounter more serious problems, because SINRs between UE antennas are changed in response to a relative position of signal amplifier antennas and mutual interference may occur between antennas. For example, it is assumed that, although Mobile Antenna #1 is well matched to Receiving Antenna #1, Mobile Antenna #2 is improperly matched to Receiving Antenna #2. In this case, a difference in channel gain (or pathloss) between UE Rx antennas increases from the viewpoint of downlink, so that it is difficult to simultaneously transmit data through multiple streams or layers (i.e., it is difficult to achieve high rank transmission implemented with multiple Rx antennas), resulting in reduction of spatial diversity. That is, the reception stability increasing effect obtained by combining Rx signals of a plurality of Rx antennas having different channel characteristics is also reduced. Similarly, since different channel gains are generated between UE Tx antennas from the viewpoint of uplink, the probability that data is to be transmitted using a high rank is reduced and the transmit diversity effect is also reduced. Therefore, a method for minimizing signal attenuation between a wireless device and a signal amplifier and optimizing MIMO performance has been proposed. Specifically, a method for converting a channel between the signal amplifier and the wireless device into a parallel SISO channel through antenna and frequency characteristics of a wireless device and associated adaptive link formation and optimizing performance of the signal amplifier has recently been proposed.

DISCLOSURE

Technical Problem

Accordingly, the present invention is directed to a method and apparatus for amplifying a MIMO signal in a wireless communication system that substantially obviates one or more problems due to limitations and disadvantages of the related art.

An object of the present invention is to provide a method for recognizing antenna and network characteristics of a target device, optimizing a link connected to the target device according to the recognized result, so that performance of a MIMO RF signal amplifier can be improved, and a MIMO RF signal amplifier for the method.

It is to be understood that technical objects to be achieved by the present invention are not limited to the aforementioned technical objects and other technical objects which are not mentioned herein will be apparent from the following description to one of ordinary skill in the art to which the present invention pertains.

Technical Solution

The object of the present invention can be achieved by providing a method for transmitting a signal amplifier for amplifying a Multiple Input Multiple Output (MIMO) signal in a wireless communication system including: a recognition module for recognizing network information and antenna information of a source device; and an adaptive link construction module for forming a link between a plurality of antenna with respect to the source device and a plurality of antenna with respect to the destination device on the basis of the recognized information.

In another aspect of the present invention, a method for forming a link that enables a signal amplifier to amplify a Multiple Input Multiple Output (MIMO) signal in a wireless communication system includes: recognizing network information and antenna information of a source device; and forming a link between a plurality of antenna with respect to the source device and a plurality of antenna with respect to the destination device on the basis of the recognized information.

The recognition module may obtain the antenna information on the basis of average reception power of a signal transmitted from the source device.

The signal transmitted from the source device may be a Sounding Reference Signal (SRS).

The antenna information may include information regarding at least one of antenna category, number of antennas, antenna position, and antenna gain.

The recognition module may obtain the antenna information on the basis of an electromagnetic field emitted from each antenna of the source device.

The adaptive link construction module may form a first link related to the source device, a second link related to the destination device, and a third link between the first link and the second link.

The formation of the first link may be to select at least one reception (Rx) antenna from among a plurality of antennas with respect to the source device on the basis of the recognized information.

The formation of the first link may include: if a plurality of reception (Rx) antennas corresponds to one antenna of a source user equipment (UE) from among the selected reception (Rx) antennas, performing at least one of grouping of at least one selected Rx antenna, and assigning a weight to the at least one Rx antenna.

The formation of the first link may include: if a plurality of reception (Rx) antennas corresponds to one antenna of a source user equipment (UE) from among the selected reception (Rx) antennas, distributing power to the plurality of antennas.

The plurality of antennas with respect to the source device may be movable within the signal amplifier in a manner that the antennas correspond to an antenna position of the source device.

If the number of antennas with respect to the destination device is higher than the number of a power amplifier included in the signal amplifier, the formation of the second link includes selecting an antenna corresponding to the power amplifier.

If the number of a power amplifier included in the signal amplifier is identical to the number of antennas with respect to the destination device, the formation of the second link may be to select an antenna achieving a minimum correlation from among the plurality of antennas.

It is to be understood that both the foregoing general description and the following detailed description of the present invention are exemplary and explanatory and are intended to provide further explanation of the invention as claimed.

Advantageous Effects

As is apparent from the above description, exemplary embodiments of the present invention can minimize signal loss of MIMO signals of a source device through intelligent device cognition and adaptive link formation, and at the same time can amplify the MIMO signals with minimum signal loss, such that the resultant signals can be transmitted to the destination device.

It will be appreciated by persons skilled in the art that the effects that can be achieved with the present invention are not limited to what has been particularly described hereinabove and other advantages of the present invention will be more clearly understood from the following detailed description taken in conjunction with the accompanying drawings.

DESCRIPTION OF DRAWINGS

The accompanying drawings, which are included to provide a further understanding of the invention, illustrate embodiments of the invention and together with the description serve to explain the principle of the invention.

BEST MODE

The following embodiments are proposed by combining constituent components and characteristics of the present invention according to a predetermined format. The individual constituent components or characteristics should be considered optional factors on the condition that there is no additional remark. If required, the individual constituent components or characteristics may not be combined with other components or characteristics. Also, some constituent components and/or characteristics may be combined to implement the embodiments of the present invention. The order of operations to be disclosed in the embodiments of the present invention may be changed. Some components or characteristics of any embodiment may also be included in other embodiments, or may be replaced with those of the other embodiments as necessary.

The embodiments of the present invention are disclosed on the basis of a data communication relationship between a base station and a terminal. In this case, the base station is used as a terminal node of a network via which the base station can directly communicate with the terminal. Specific operations to be conducted by the base station in the present invention may also be conducted by an upper node of the base station as necessary.

In other words, it will be obvious to those skilled in the art that various operations for enabling the base station to communicate with the terminal in a network composed of several network nodes including the base station will be conducted by the base station or other network nodes other than the base station. The term "Base Station (BS)" may be replaced with a fixed station, Node-B, eNode-B (eNB), or an access point as necessary. The term "relay" may be replaced with the terms Relay Node (RN) or Relay Station (RS). The term "terminal" may also be replaced with a User Equipment (UE), a Mobile Station (MS), a Mobile Subscriber Station (MSS) or a Subscriber Station (SS) as necessary.

It should be noted that specific terms disclosed in the present invention are proposed for convenience of description and better understanding of the present invention, and the use of these specific terms may be changed to other formats within the technical scope or spirit of the present invention.

In some instances, well-known structures and devices are omitted in order to avoid obscuring the concepts of the present invention and important functions of the structures and devices are shown in block diagram form. The same reference numbers will be used throughout the drawings to refer to the same or like parts.

Exemplary embodiments of the present invention are supported by standard documents disclosed for at least one of wireless access systems including an Institute of Electrical and Electronics Engineers (IEEE) 802 system, a $3^{rd}$ Generation Partnership Project (3GPP) system, a 3GPP Long Term Evolution (LTE) system, an LTE-Advanced (LTE-A) system, and a 3GPP2 system. In particular, steps or parts, which are not described to clearly reveal the technical idea of the present invention, in the embodiments of the present invention may be supported by the above documents. All terminology used herein may be supported by at least one of the above-mentioned documents.

The following embodiments of the present invention can be applied to a variety of wireless access technologies, for example, CDMA (Code Division Multiple Access), FDMA (Frequency Division Multiple Access), TDMA (Time Division Multiple Access), OFDMA (Orthogonal Frequency Division Multiple Access), SC-FDMA (Single Carrier Frequency Division Multiple Access), and the like. CDMA may be embodied through wireless (or radio) technology such as UTRA (Universal Terrestrial Radio Access) or CDMA2000. TDMA may be embodied through wireless (or radio) technology such as GSM (Global System for Mobile communication)/GPRS (General Packet Radio Service)/EDGE (Enhanced Data Rates for GSM Evolution). OFDMA may be embodied through wireless (or radio) technology such as Institute of Electrical and Electronics Engineers (IEEE) 802.11 (Wi-Fi), IEEE 802.16 (WiMAX), IEEE 802-20, and E-UTRA (Evolved UTRA). UTRA is a part of UMTS (Universal Mobile Telecommunications System). 3GPP (3rd Generation Partnership Project) LTE (long term evolution) is a part of E-UMTS (Evolved UMTS), which uses E-UTRA. 3GPP LTE employs OFDMA in downlink and employs SC-FDMA in uplink. LTE-Advanced (LTE-A) is an evolved version of 3GPP LTE. WiMAX can be explained by IEEE 802.16e (WirelessMAN-OFDMA Reference System) and advanced IEEE 802.16m (WirelessMAN-OFDMA Advanced System). For clarity, the following description focuses on IEEE 802.11 systems. However, technical features of the present invention are not limited thereto.

In order to solve the problems of a general MIMO signal amplifier, a MIMO signal amplifier for performing intelligent device cognition and adaptive link formation on the basis of the intelligent device cognition according to the embodiment of the present invention will hereinafter be described in detail. In this case, MIMO represents not only the presence of a plurality of Rx antennas (or external antenna connection ports) capable of receiving a signal from a source device configured to transmit a signal of a target to be amplified, but also the presence of a plurality of Tx antennas (or external antenna connection ports) capable of transmitting a signal amplified by the signal amplifier to a destination device (for example, BS, AP, or the like). In addition, the signal amplifier proposed by the present invention includes a (intelligent device) recognition module for intelligent device cognition, and a (adaptive) link construction module for forming a link between a plurality of antennas with respect to source device and a plurality of antennas with respect to a destination device on the basis of the recognized information. The principal constituent elements and functions of the signal amplifiers will hereinafter be described in detail.

Intelligent Device Cognition Module

Before the intelligent device cognition module (based on a contact type or a non-contact type to be described later) transmits and receives a signal to/from the source device, the intelligent device cognition module can recognize antenna, network, and frequency characteristics of the source device, and can optimize a link with the source device on the basis of the recognized result.

In more detail, the signal amplifier includes a plurality of antennas and a plurality of antenna modules to communicate with the source device. In the case of supporting multiple bands of one network (e.g., GSM, CDMA, HSPA, LTE, LTE-A, corresponding release, Wi-Fi, GPS, etc.) to one network, the signal amplifier may include an antenna module for supporting multiple bands. The signal amplifier may decide an optimum antenna position with respect to the source device not only through the antenna module but also through the intelligent device cognition module including the antenna module.

Here, the intelligent device cognition module may recognize network information and antenna information that can be supported by the signal amplifier. In this case, the network information may include i) a communication network of the source device, and ii) at least one operation band of the communication network of the source device. In addition, the antenna information may include at least one of (i) the type of antenna, (ii) the number of antennas, (iii) the antenna position, and (iv) an antenna gain.

The intelligent device cognition module may operate in relation to an RF receiver contained in a MIMO RF signal amplifier based on the proposed device cognition, or may be comprised as a separate module.

In order to recognize the above-mentioned network information and/or antenna information, the intelligent device cognition module may use the following methods.

First, the intelligent device cognition module measures Rx power for each antenna with respect to a signal transmitted from the source device, and compares the Rx powers with each other, such that it can select an optimum antenna of the signal amplifier. In this case, the Rx power for each antenna may be average Rx power of an RF signal (i.e., an RF signal from which carrier is removed, or a signal generated by a pulse shaping filter after carrier cancellation) received for a specific time during either the whole band of a specific network or an operation band of the source device. Alternatively, the Rx power for each antenna may be average Rx power for each antenna port of a digital baseband signal (i.e., a demodulated/decoded digital signal) received for a specific time during either the whole band of a specific network or an operation band of the source device. As an example of the digital baseband signal in case of the LTE/LTE-A system, the digital baseband signal may be a Sounding Reference Signal (SRS).

Second, the intelligent recognition module measures an electromagnetic field emitted from each antenna of the source device through each Rx antenna, and compares the measured electromagnetic fields with each other, such that it can select an optimum antenna of the signal amplifier according to the result of comparison.

Third, the intelligent recognition module receives antenna and network information from the source device such that it may indirectly perform device cognition. One of the indirect device cognition methods is to receive information from the source device. Upon receiving a request from the source device or the signal amplifier, the signal amplifier may receive antenna and network information from the source device. In more detail, to facilitate device cognition, antenna and/or network information of each UE available as the source device may be pre-stored in the signal amplifier, the intelligent recognition module receives and compares information (for example, a model name, a serial number, etc. of the source device) capable of identifying the source device, such that it may obtain the corresponding information. Alternatively, the intelligent recognition module may directly receive antenna and network information from the source device through an application.

The intelligent device cognition process may occur only in so far as the source device is not changed to another device, or may occur only in an initial setup process. In addition, after the intelligent device cognition module recognizes the source device, it registers and stores information (i.e., antenna type, the number of antennas, a supported network type, operation frequency bands, etc.) of the source device through the storage unit, and utilizes the corresponding information, so that the above-mentioned recognition process can be shortened and simplified. For example, UE recognition may be automatically carried out through user input of various information (for example, a phone number, a UE model name, a serial number, etc.) capable of identifying the source device. In this case, the user input information may include not only direct information of a user who uses the signal amplifier, but also information transmission to the signal amplifier by direct/indirect input of a user who uses the source device. For example, the information transmission may be transmission of information through an RFID transmitter or NFC transmitter including the corresponding information. If the position of the source device is changed by a specific limit or greater due to vehicle shock and vibration, user carelessness, etc., the above-mentioned device cognition process may be re-performed. For this purpose, the device cognition module compares a current power value with a previous allocation power weight or periodically measures a transmission power or energy) or an electromagnetic field in response to an antenna radiation pattern received from the source device, so that it can select at least one optimum antenna module for the position of the UE antenna.

Detailed Embodiment of Intelligent Device Cognition Module

The intelligent device cognition modules are classified into a contact-type recognition module and a non-contact-type recognition module according to a channel formation scheme with respect to the source device. The intelligent device cognition modules may be classified into a fixed antenna scheme and a mobile antenna scheme according to implementation methods of the antenna module for device cognition, and a detailed description thereof will hereinafter be described in detail.

Figure 5:
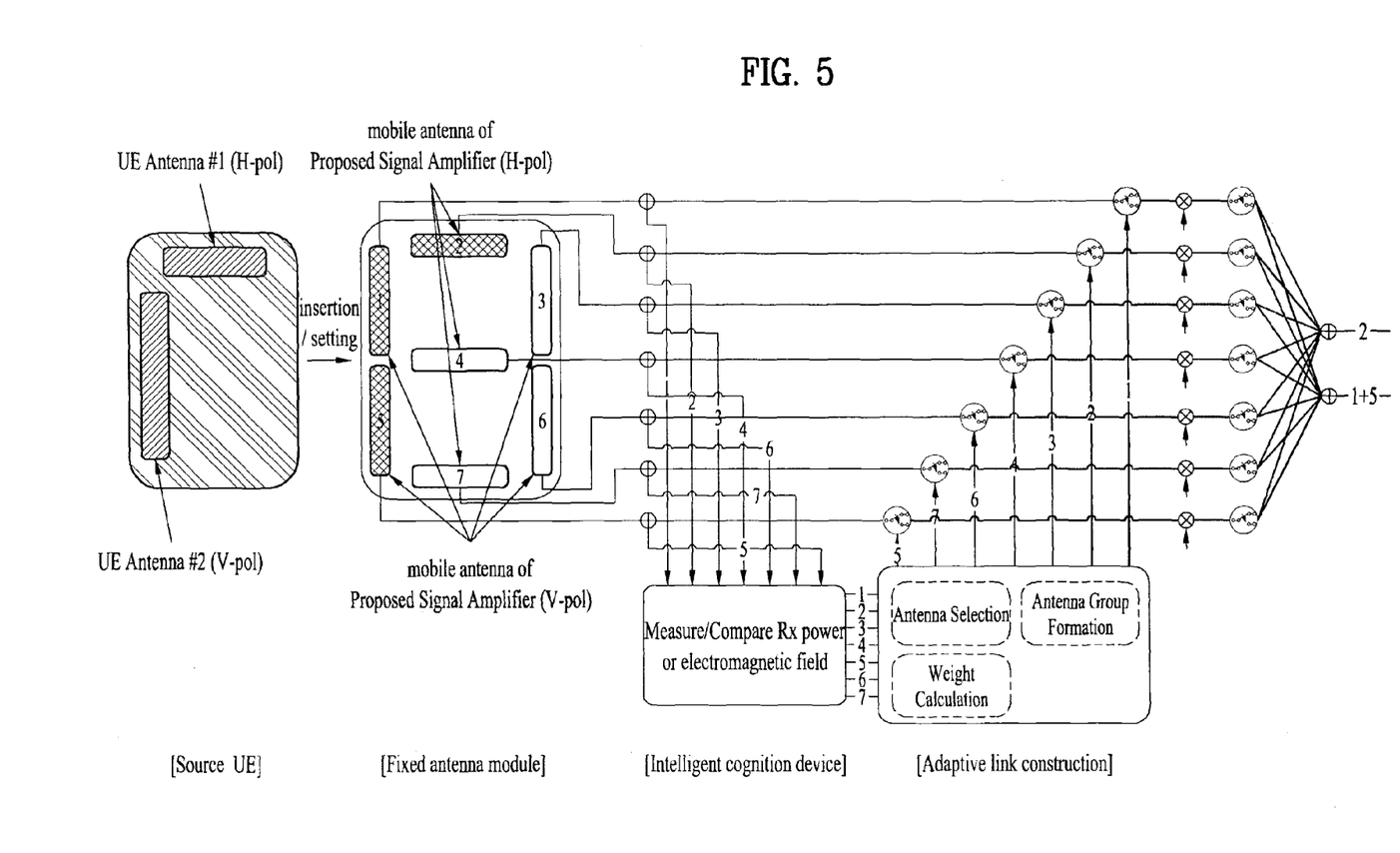
FIG. 5 is a conceptual diagram illustrating a device cognition module of a fixed antenna scheme having a non-contact interface according to an embodiment of the present invention.

First, the fixed type antenna scheme includes at least one fixed type antenna module from among non-contact-type channel formation schemes. The intelligent device cognition module recognizes the position and combination of an optimum antenna for antenna and network characteristics of the source device from among a plurality of fixed antenna modules, and may selectively activate only the corresponding antenna modules. In addition, assuming that multiple antenna modules are selected and the corresponding antenna is actually recognized as one antenna, grouping of the corresponding antenna may be carried out. The non-contact-type intelligent device cognition module and the fixed type antenna scheme intelligent device cognition module are shown in FIG. 5. Referring to FIG. 5, if the source device (source UE) transmits signals using UE antenna #1 (i.e., Mobile Antenna #1) and UE antenna #2 (i.e., Mobile Antenna #2) having different pol characteristics, the intelligent device cognition module may recognize and select antennas (#1, #2, #5) with respect to the source device from among a plurality of Rx antennas (#1, #2, . . . , #6). The adaptive link construction module recognizes that Antenna #1 and Antenna #5 correspond to one antenna (i.e., UE antenna #2) of the source device, and the recognized result is grouped so that the grouping result may be considered as one antenna.

Figure 6:
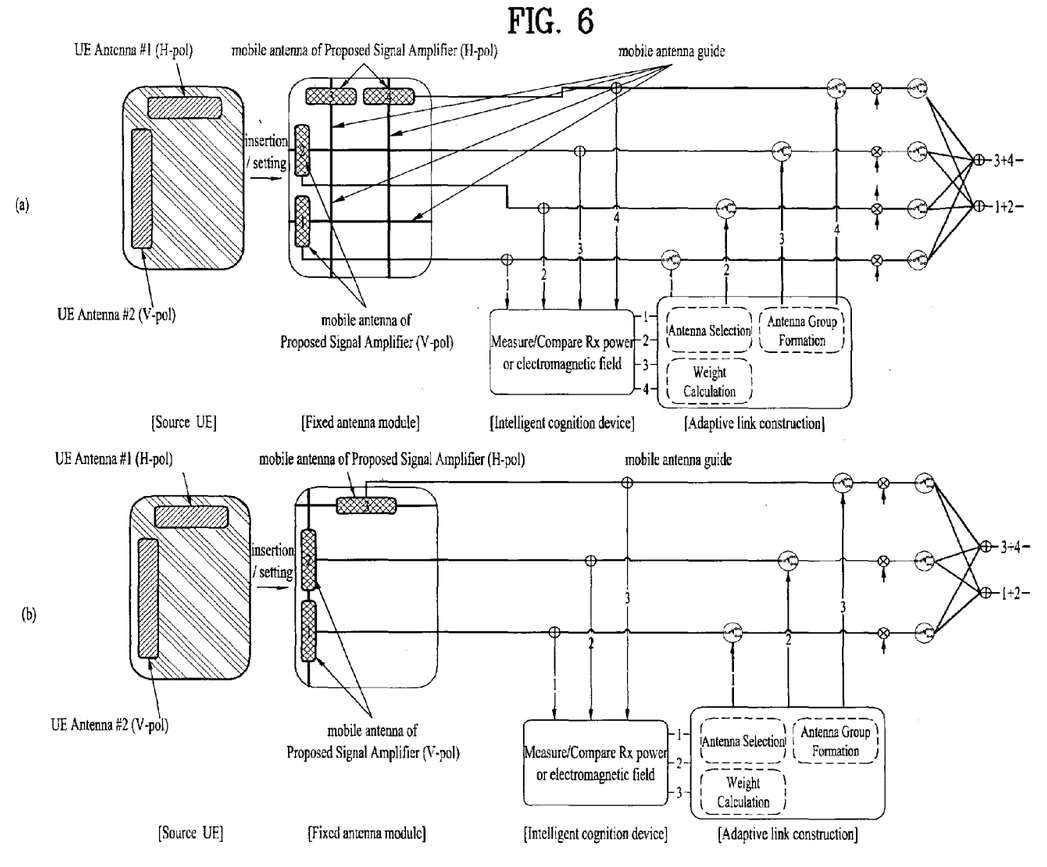
FIGS. 6(a) to 6(b) are conceptual diagrams illustrating a device cognition module of a mobile antenna scheme having a non-contact interface according to an embodiment of the present invention.

Second, the mobile-type antenna scheme having a non-contact-type interface may be used. The mobile-type antenna scheme may include at least one mobile antenna module and an antenna guide. Here, the term "mobile type" means that at least one of an antenna module and an antenna module guide is movable. That is, the mobile antenna scheme having a non-contact-type interface is configured to actively scan data through an antenna, an antenna fixed to a mobile guide, or an antenna movable on the mobile guide, and recognizes the position of an optimum antenna with respect to the source device, so that it can form an optimum link to a channel related to the source device. The mobile type antenna scheme may be a single guide/single antenna scheme including a single antenna in a single antenna guide as shown in FIG. 6(a), or may be a single guide/multiple-antenna scheme including multiple antennas in a single antenna guide as shown in FIG. 6(b).

Third, the contact-type channel construction method may be used. It may be difficult to actually implement the above-mentioned non-contact-type channel construction method to correspond to multiple bands in various networks or a certain network. For this purpose, although a separate antenna is used in association with network categories, multi-band antennas may be applied to one network. The multi-band antenna may be an antenna supporting a plurality of resonance frequencies to one physical antenna. For example, a Planar Inverted F Antenna (PIFA) for use in cellular communication may be used as the multi-band antenna. As an example of PIFA, a power amplifier is present in the device, and the antenna may be mounted to a case or like of the device. As described above, if the antenna is located outside, and if a contact point (or antenna feeder) or an external interface is present, the intelligent device cognition module may be directly connected to the source device, resulting in formation of a wireless channel.

The contact-type channel formation scheme may recognize the source device in a similar way to the mobile antenna scheme of the above-mentioned non-contact-type channel formation method. That is, according to the single guide/single antenna module scheme or the single guide/multi-antenna module, the antenna module is replaced with an antenna contact point, and such replacement is actively scanned, so that the antenna contact point of the source device can be intelligently recognized, and a wireless channel having minimum interference and throughput deterioration may be formed on a radio frequency (RF) channel.

As another example of the contact type channel formation scheme, the signal amplifier's antenna contact point corresponding to the antenna contact point of the source device may be passively adjusted and connected as necessary. Alternatively, antenna contact points between devices may be directly interconnected through a separate wired cable.

Adaptive Link Construction Module

As described above, the signal amplifier including the intelligent device cognition module may include an interface and transceiver device with respect to the source device, an internal controller, an adaptive link construction module, and an interface and transceiver device with respect to the destination device. In this case, the adaptive link construction module may include i) a first link related to an interface with respect to the source device, ii) a second link related to an interface with respect to the destination device, and iii) a third link related to internal connection processes of the first and second links.

First, a method for forming the first link (i) related to an interface with respect to the source device will be described. As described above, the proposed device cognition based MIMO RF signal amplifier may decide the number of antennas to be used for communication with the source device, the position of each antenna, the type of antennas, the network categories and operation frequency, etc. through the intelligent device cognition process. According to the interface implementation scheme with respect to the source device for use in the intelligent device cognition module, the adaptive link formation process may be carried out through antenna selection, antenna grouping, etc. That is, each antenna is identified according to respective antenna types. Multiple antennas of the signal amplifier corresponding to a single antenna of the source device are used and grouped, so that the grouping result may be substantially recognized as a single antenna. A predetermined weight may be calculated/assigned in a manner that the selected antenna or antennas of the selected antenna group may have optimum performance. For example, assuming that multiple antennas are used as antennas of the signal amplifier corresponding to a single antenna of the source device, different optimum powers may be required for respective antennas, and such different optimum powers may be compensated through Adaptive Power Allocation/Adaptive Power Balancing (APA/APB). In addition, the weight may be applied to antenna selection and grouping, or may also be applied after antenna grouping.

The weight and antenna selection and the grouping decision may be carried out by a command of the internal controller. In this case, antenna selection, grouping, and weight calculation and application may be carried out in an initial UE recognition and registration process or a periodic/aperiodic check process. However, antenna selection, grouping, etc. may be omitted for process simplification when the source device is changed to another or there is no serious position variation of the source device.

Referring to the second link (ii) related to an interface with respect to the destination device, the signal amplifier may perform adaptive link formation processes, such as antenna selection, antenna grouping, weight calculation and assignment, in a channel with respect to the destination device.

In this case, antenna selection may be required for diversity gain. That is, the signal amplifier may have many more antenna modules than those of the power amplifier. In this case, the antenna module corresponding to each power amplifier may be selected.

In addition, although the signal amplifier may have as many antennas as the number of power amplifiers, a narrow space between antennas may be achieved due to spatial limitations. In this case, it is possible to select antennas having a maximum number of correlations within the limitations of the categories and number of supportable antennas.

In case of supporting multiple networks or multiple bands of one network, an optimum antenna length may be changed in response to the categories and operation frequency band of the network. However, it is impossible to satisfy such changeable antenna length due to spatial or implementation limitation. In this case, the above-mentioned problem can be solved through antenna length extension based on antenna grouping.

Subsequently, a method for forming a third link related to internal connection processes of the first and second links will hereinafter be described in detail.

The signal amplifier must form not only a channel link of the final source device that is decided through the intelligent device cognition process and the adaptive link formation process for the interface with respect to the source device, but also a link related to the interface with respect to the destination device. For this purpose, the signal amplifier may perform a connection process between the first link and the second link for the interface with respect to the destination device. In case of using the fixed type antennas of the interface with respect to the destination device, the method for forming the second link may be omitted and antenna selection, grouping, weight assignment, etc. may be performed in the connection process for the interface with respect to the destination device.

Figure 7:
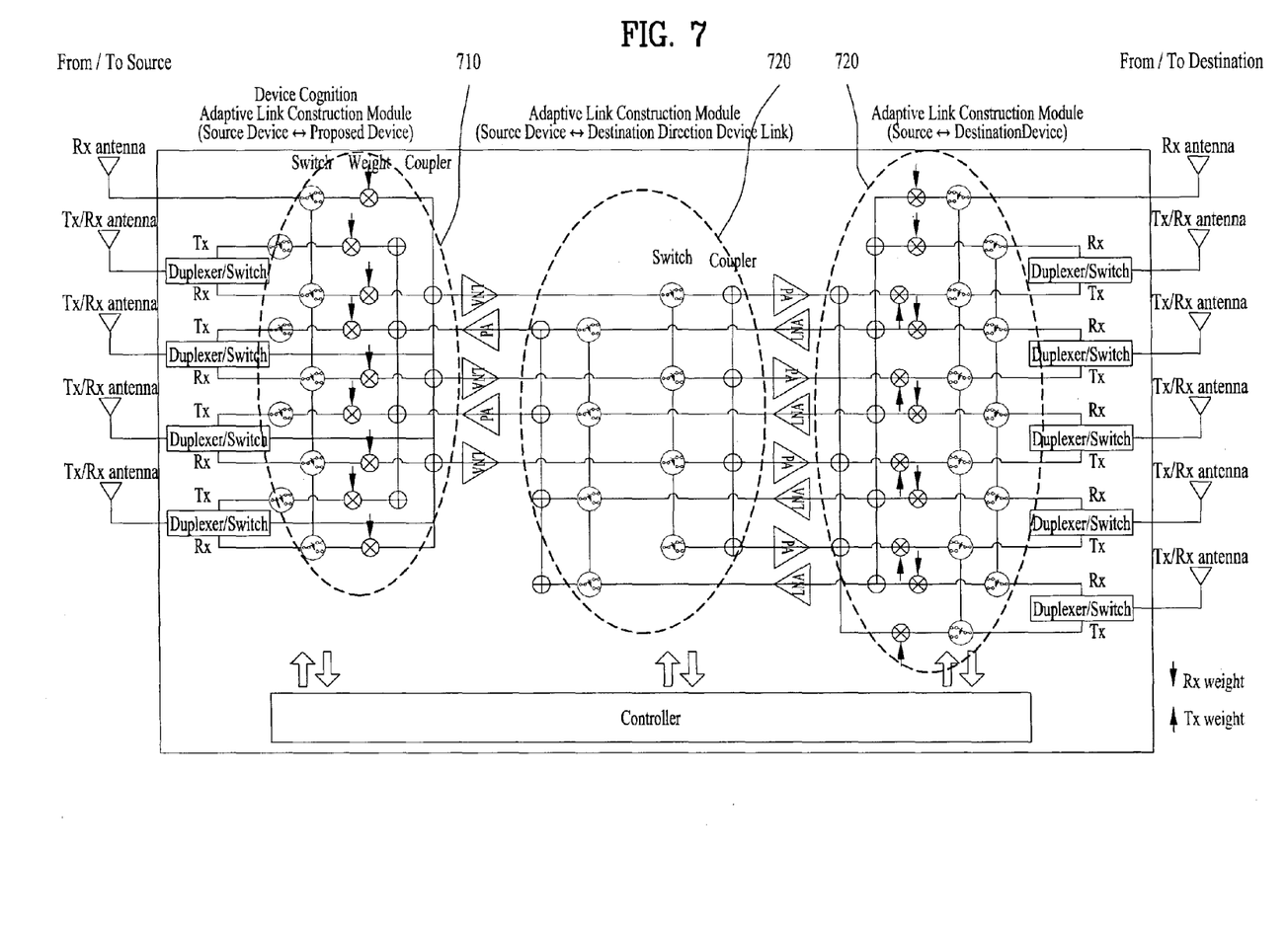
FIG. 7 is a schematic diagram illustrating a signal amplifier including an adaptive link construction module according to an embodiment of the present invention.

FIG. 7 is a conceptual diagram illustrating a MIMO RF signal amplifier including an adaptive link construction module according to the embodiment of the present invention. Referring to FIG. 7, the adaptive link construction module may form i) a first link 710 related to the interface with respect to the source device, ii) a second link 720 related to an interface with respect to the destination device and iii) a third link 730 related to an internal connection process of the first and second links.

The controller contained in the link construction module shown in FIG. 7 may decide link selection for adaptive link construction, The controller contained in the link construction module may decide a link selection for adaptive link construction, amplification and phase coefficient needed for distribution and combination, link selection information, etc. Source device information obtained through the intelligent device is contained in input information of the controller, and may affect output values of the controller. For example, antenna location information obtained through the intelligent device may greatly affect antenna selection for communication with the source device during adaptive link construction. The controller may include a model and channel estimation module for demodulating/decoding a digital baseband signal for all or some parts of the communication system. For example, the controller may receive not only a reference signal (RS) of a communication system but also channel estimation signals such as a pilot signal or a preamble signal and estimate a Degree of Arrival (DoA) and/or a Power Azimuth Spectrum (PAS) through the received information, such that it may calculate/apply Rx and/or Tx beam steering weights according to the estimated result. Tx/Rx beamforming may be implemented through a Phase Shifted Beamforming scheme or Analog Beamforming scheme. The above-mentioned beamforming scheme is configured to use an average value of DoA and PAS estimated in a time domain, so that the resultant beamforming scheme may operate according to Long-Term Beamforming in a time domain.

As described above, the following explanation may further be applied to the signal amplifier including the intelligent device cognition module and adaptive link construction module according to embodiments of the present invention.

The signal amplifier may operate by partially, inserting or completely inserting the source device into the corresponding device, or mounting the source device of the standing type to the corresponding device. If the source device is spaced apart from the non-contact-type signal amplifier by a predetermined distance or greater, the signal amplifier may operate in relation to the type of antennas, the number of antennas, the network type, and the operation frequency on the basis of well known antenna information and network information of the well known source device, the spacing between antennas is maximized, so that the signal amplifier may operate in a similar way to a general MIMO RF signal amplifier. If the antenna information of the source device is insufficient or absent, the signal amplifier may operate by operating only one antenna within supportable networks or a recognized network or operation band.

Figure 8:
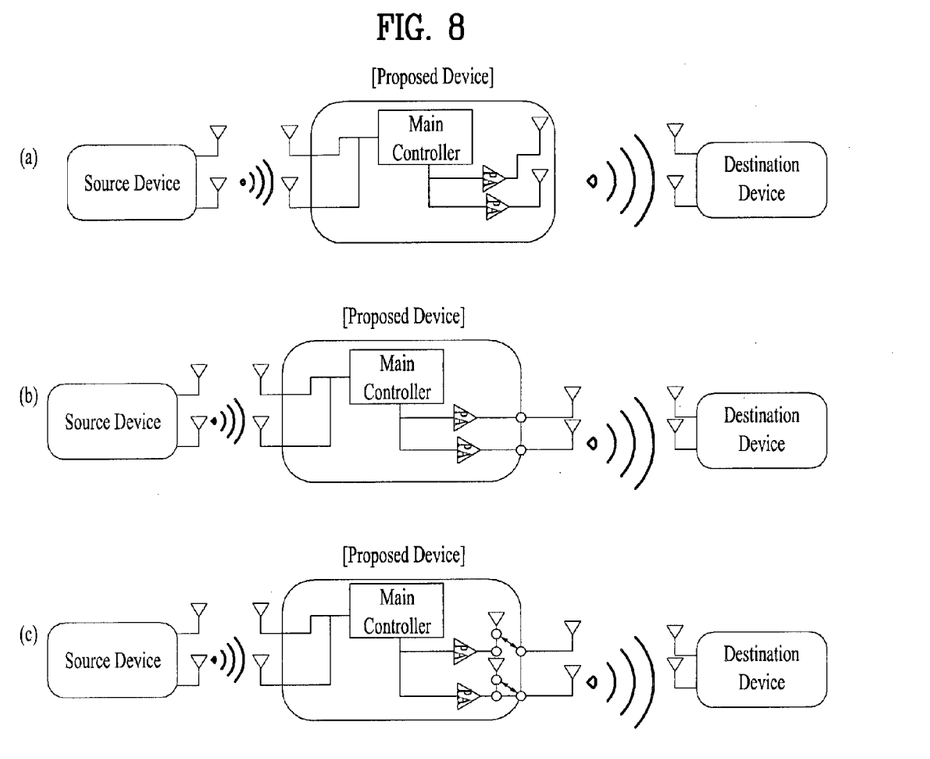
FIGS. 8(a) to 8(c) are schematic diagrams illustrating an antenna device of a signal amplifier according to an embodiment of the present invention.

In association with the construction of (Tx) antennas with respect to the destination device of the signal amplifier, the signal amplifier may include a plurality of internal antennas to communicate with the destination device as shown in FIG. 8(a). Alternatively, the signal amplifier may include only a port (an antenna detachable type or an external antenna use model) capable of being connected to an external antenna as shown in FIG. 8(b). That is, an antenna for communication with the destination device may be attached to the signal amplifier as necessary. In addition, the signal amplifier may selectively use the external antenna and the internal antenna as shown in FIG. 8(c) (hybrid format). In this case, insertion of the external antenna may be recognized, and a path toward the internal antenna may be automatically cut off.

The signal amplifier may improve communication performance between the source device and the destination device. For this purpose, the signal amplifier may further include a power amplifier including the source device, a higher performance power amplifier as compared to antenna performance, and/or a higher performance antenna module. That is, it is possible to overcome limited hardware performance of the source device, and interference and pathloss between antennas can be minimized, so that the source device performance can be indirectly maximized through optimization. In addition, the signal amplifier may overcome performance deterioration caused by shield/voice of a channel environment of a vehicle and a building through a plurality of separate external antennas.

The detailed description of the exemplary embodiments of the present invention has been given to enable those skilled in the art to implement and practice the invention. Although the invention has been described with reference to the exemplary embodiments, those skilled in the art will appreciate that various modifications and variations can be made in the present invention without departing from the spirit or scope of the invention described in the appended claims. For example, those skilled in the art may use each construction described in the above embodiments in combination with each other. Accordingly, the invention should not be limited to the specific embodiments described herein, but should be accorded the broadest scope consistent with the principles and novel features disclosed herein.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it will be obvious to those skilled in the art that claims that are not explicitly cited in the appended claims may be presented in combination as an exemplary embodiment of the present invention or included as a new claim by subsequent amendment after the application is filed.

MODE FOR INVENTION

Various embodiments have been described in the best mode for carrying out the invention.

INDUSTRIAL APPLICABILITY

The embodiments of the present invention can be applied to a variety of mobile communication systems.

The invention claimed is:

1. A signal amplifier for amplifying a Multiple Input Multiple Output (MIMO) signal in a wireless communication system comprising:
   a recognition module for recognizing network information and antenna information of a source device; and
   an adaptive link construction module for forming a first link between a plurality of antennas with respect to the source device and a plurality of antennas with respect to the destination device on the basis of the recognized information,
   wherein the formation of the first link includes selecting at least one reception (Rx) of the signal amplifier from among a plurality of antennas with respect to the source device on the basis of the recognized information.

2. The signal amplifier according to claim 1, wherein the recognition module obtains the antenna information on the basis of average reception power of a signal transmitted from the source device.

3. The signal amplifier according to claim 2, wherein the signal transmitted from the source device is a Sounding Reference Signal (SRS).

4. The signal amplifier according to claim 1, wherein the antenna information includes information regarding at least one of antenna category, number of antennas, antenna position, and antenna gain.

5. The signal amplifier according to claim 1, wherein the recognition module obtains the antenna information on the basis of an electromagnetic field emitted from each antenna of the source device.

6. The signal amplifier according to claim 1, wherein the adaptive link construction module forms the first link related to the source device, a second link related to the destination device, and a third link between the first link and the second link.

7. The signal amplifier according to claim 6, wherein:
   when the number of antennas with respect to the destination device is higher than the number of a power amplifier included in the signal amplifier, the formation of the second link includes selecting an antenna corresponding to the power amplifier.

8. The signal amplifier according to claim 6, wherein:
   when the number of a power amplifier included in the signal amplifier is identical to the number of antennas with respect to the destination device, the formation of the second link includes selecting an antenna achieving a minimum correlation from among the plurality of antennas.

9. The signal amplifier according to claim 1, wherein the formation of the first link includes:
   when a plurality of reception (Rx) antennas corresponds to one antenna of a source device from among the selected reception (Rx) antennas, performing at least one of grouping of at least one selected Rx antenna, and assigning a weight to the at least one Rx antenna.

10. The signal amplifier according to claim 1, wherein the formation of the first link includes:
    when a plurality of reception (Rx) antennas corresponds to one antenna of a source device from among the selected reception (Rx) antennas, distributing power to the plurality of antennas.

11. The signal amplifier according to claim 1, wherein the plurality of antennas with respect to the source device is movable within the signal amplifier in a manner that the antennas correspond to an antenna position of the source device.

12. A method for forming a link that enables a signal amplifier to amplify a Multiple Input Multiple Output (MIMO) signal in a wireless communication system, the method comprising:
    recognizing network information and antenna information of a source device; and
    forming a first link between a plurality of antennas with respect to the source device and a plurality of antennas with respect to the destination device on the basis of the recognized information,
    wherein the formation of the first link includes selecting at least one reception (Rx) of the signal amplifier from among a plurality of antennas with respect to the source device on the basis of the recognized information.

* * * * *